(12) United States Patent
Simpson et al.

(10) Patent No.: US 12,338,524 B1
(45) Date of Patent: Jun. 24, 2025

(54) DURABLE, OPTICALLY TRANSPARENT, AND SUPERHYDROPHOBIC COATING

(71) Applicant: Waymo LLC, Mountain View, CA (US)

(72) Inventors: John T. Simpson, Sahuarita, AZ (US); Bryce Remesch, San Jose, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 18/491,096

(22) Filed: Oct. 20, 2023

Related U.S. Application Data

(62) Division of application No. 17/686,681, filed on Mar. 4, 2022, now Pat. No. 11,827,969.

(Continued)

(51) Int. Cl.
| | |
|---|---|
| *C23C 14/06* | (2006.01) |
| *C01B 32/205* | (2017.01) |
| *C01B 32/21* | (2017.01) |
| *C01B 32/26* | (2017.01) |
| *C01B 32/28* | (2017.01) |
| *C03C 17/00* | (2006.01) |

(Continued)

(52) U.S. Cl.
CPC ........ *C23C 14/0605* (2013.01); *C01B 32/205* (2017.08); *C01B 32/21* (2017.08); *C01B 32/26* (2017.08); *C01B 32/28* (2017.08); *C03C 17/007* (2013.01); *C03C 17/009* (2013.01); *C09D 5/02* (2013.01); *C23C 14/34* (2013.01); *C23C 14/5873* (2013.01); *C03C 2217/29* (2013.01); *C03C 2217/76* (2013.01); *C03C 2218/113* (2013.01); *Y10T 428/24521* (2015.01); *Y10T 428/24612* (2015.01); *Y10T 428/2462* (2015.01)

(58) Field of Classification Search
CPC . C23C 14/0605; C23C 14/34; C23C 14/5873; C01B 32/205; C01B 32/21; C01B 32/26; C01B 32/28; C03C 17/007; C03C 17/009; C03C 2217/29; C03C 2217/76; C03C 2218/113; C09D 5/02; Y10T 428/24521; Y10T 428/24612; Y10T 428/2462
See application file for complete search history.

(56) References Cited

U.S. PATENT DOCUMENTS

| | | | |
|---|---|---|---|
| 6,933,112 B1 * | 8/2005 | Drewes | G01N 21/7703 422/50 |
| 11,827,969 B1 | 11/2023 | Simpson et al. | |

(Continued)

FOREIGN PATENT DOCUMENTS

| | | |
|---|---|---|
| WO | 2019070296 A1 | 4/2019 |
| WO | 2022072715 A1 | 4/2022 |

*Primary Examiner* — James Lin
*Assistant Examiner* — Patrick S Ott
(74) *Attorney, Agent, or Firm* — MCDONNELL BOEHNEN HULBERT & BERGHOFF LLP

(57) ABSTRACT

An article including a durable, optically transparent, and superhydrophobic coating is described. In one aspect, the present disclosure provides an article comprising a substrate, and disposed adjacent the substrate, a layer comprising graphitic carbon, diamond-like carbon, and aerogel. In another aspect, the present disclosure provides a method for preparing a coated substrate, comprising providing a carbon layer disposed on a substrate and having a textured surface; and disposing aerogel adjacent to at least a portion of the textured surface.

20 Claims, 2 Drawing Sheets

Related U.S. Application Data

(60) Provisional application No. 63/165,245, filed on Mar. 24, 2021.

(51) Int. Cl.
*C09D 5/02* (2006.01)
*C23C 14/34* (2006.01)
*C23C 14/58* (2006.01)

(56) References Cited

U.S. PATENT DOCUMENTS

| | | | |
|---|---|---|---|
| 2002/0192472 A1* | 12/2002 | Metz | C03C 17/42 428/426 |
| 2010/0206470 A1 | 8/2010 | Chen et al. | |
| 2012/0028798 A1 | 2/2012 | Worsley et al. | |
| 2013/0142994 A1* | 6/2013 | Wang | C03C 17/2456 427/595 |
| 2013/0187169 A1 | 7/2013 | Taylor et al. | |
| 2015/0004363 A1* | 1/2015 | Zhang | C23C 14/5806 204/192.15 |
| 2015/0147523 A1* | 5/2015 | Kumar | C23C 16/26 427/527 |
| 2017/0213821 A1 | 7/2017 | Or-Bach et al. | |
| 2018/0112054 A1 | 4/2018 | Steiner, III et al. | |
| 2018/0237304 A1 | 8/2018 | Khe et al. | |
| 2020/0020935 A1 | 1/2020 | Costantino et al. | |
| 2020/0392362 A1* | 12/2020 | Simpson | B05D 7/50 |
| 2021/0363016 A1 | 11/2021 | Alkhazraji | |
| 2021/0403725 A1 | 12/2021 | Dousset et al. | |
| 2022/0363829 A1 | 11/2022 | Steiner, III et al. | |

* cited by examiner

DURABLE, OPTICALLY TRANSPARENT, AND SUPERHYDROPHOBIC COATING

CROSS-REFERENCE TO RELATED APPLICATIONS

This application is a division of U.S. patent application Ser. No. 17/686,681, filed Mar. 4, 2022, which claimed the benefit of U.S. Provisional Patent Application No. 63/165,245, filed Mar. 24, 2021. The foregoing applications are incorporated herein by reference.

BACKGROUND

Unless otherwise indicated herein, the materials described in this section are not prior art to the claims in this application and are not admitted to be prior art by inclusion in this section.

Superhydrophobic coatings having exceptional water repellency properties have potential application in numerous fields of endeavor. Although superhydrophobic materials have been achieved, conventional superhydrophobic materials have micron-scale roughness, and accordingly tend to scatter light, making optical clarity difficult to achieve. Moreover, such materials are often susceptible to shear force, which can remove some of the surface texturing (e.g., nano-texturing and/or micro-texturing).

Conventional superhydrophobic materials, then, are of limited use as coatings in optical applications, and particularly in those involving exposure to weathering conditions.

There accordingly remains a need for durable, optically transparent coatings.

SUMMARY

In one aspect, the present disclosure provides an article comprising a substrate; and disposed adjacent the substrate, a layer having a first side adjacent the substrate and an opposed second side, the disposed layer comprising graphitic carbon and diamond-like carbon, present in a combined amount of 60-98 wt. %; and aerogel, present in an amount of 2-40 wt. %.

In another aspect, the present disclosure provides a method for preparing a coated substrate, comprising providing a carbon layer disposed on a substrate, the carbon layer having a first side adjacent the substrate and an opposed second side having a textured surface, the carbon layer comprising at least 80 wt. % of a combined amount of graphitic carbon and diamond-like carbon; and disposing aerogel adjacent to at least a portion of the textured surface; wherein the textured surface comprises a plurality of spaced features extending perpendicularly to the substrate and comprising at least a portion of the graphitic carbon and diamond-like carbon, the features having an average spacing of 10-2000 nm.

In another aspect, the present disclosure provides a coated substrate, prepared according to a method described herein.

These as well as other aspects, advantages, and alternatives, will become apparent to those of ordinary skill in the art by reading the following detailed description, with reference where appropriate to the accompanying drawings.

Figure 1:
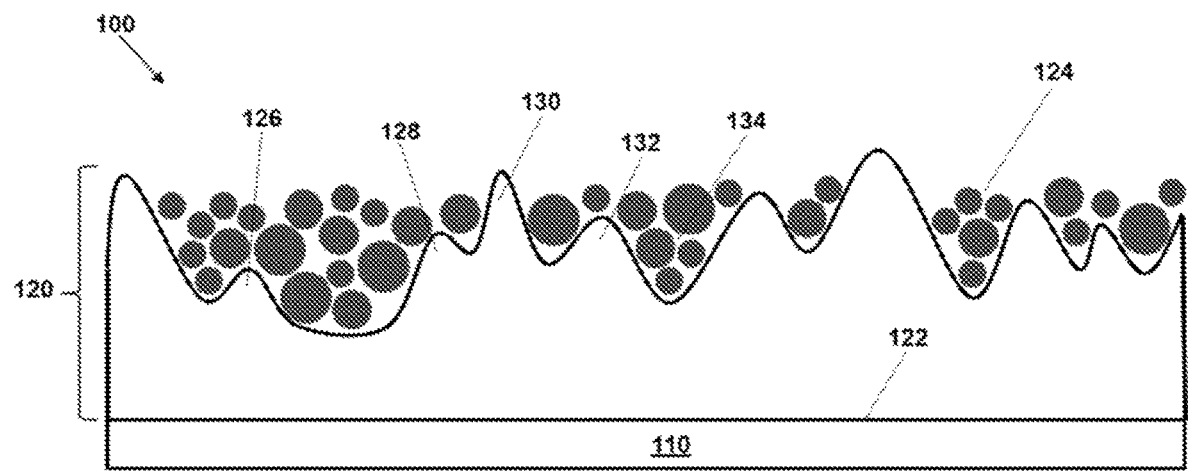
FIG. 1 is a schematic cross-sectional view of an article according to one embodiment of the disclosure.

The figures are illustrated for simplicity and clarity and have not necessarily been drawn to scale. For example, the dimensions of some of the elements in the figures can be exaggerated relative to other elements to help improve understanding of certain embodiments of the present disclosure.

DETAILED DESCRIPTION

The following detailed description describes various features and functions of the disclosed methods, compositions, and structures. The illustrative embodiments described herein are not meant to be limiting. It will be readily understood that certain aspects of the disclosed methods, compositions, and structures can be arranged and combined in a wide variety of different configurations, all of which are contemplated herein.

An article including a durable, optically transparent, and superhydrophobic coating is described. The coating comprises, disposed adjacent a substrate, a layer comprising graphitic carbon, diamond-like carbon, and aerogel. To achieve such a coating, a carbon layer can be provided (e.g., by a physical vapor deposition process) on a substrate, such that the carbon layer comprises diamond-like carbon (e.g., having a 3D volumetric topology) and graphitic carbon (e.g., having a 2D planar topography) and has a textured surface (e.g., having a topography of features comprising diamond-like carbon and/or graphitic carbon), and then aerogel can be disposed interstitially between spaced features of the textured surface. Advantageously, the disposed aerogel, protected from shear forces by the spaced features of the carbon layer, can significantly improve the durability and/or hydrophobicity of the carbon layer-containing coating, without significantly affecting optical clarity.

"Superhydrophobic," as used herein, describes surfaces or coatings that have a water contact angle of at least about 130°. And as used herein, an "optically transparent" coating transmits at least about 90% of incident light (e.g., having a wavelength in the range of 400-1600 nm).

As used herein, "diamond-like carbon" refers to at least nano-scale domains (having a dimension of at least 1 nm, e.g., 1-500 nm, or 0.1-5 μm, or even 5 μm or greater) of amorphous or crystalline carbon, wherein the carbon present in the domain is predominantly $sp^3$-hybridized (e.g., having an $sp^3$ fraction of at least 50 wt. %, or at least 75 wt. %, or at least 90 wt. %), while "graphitic carbon" refers to those domains in which the carbon present is predominantly $sp^2$-hybridized (e.g., having an $sp^2$ fraction of at least 50 wt. %, or at least 75 wt. %, or at least 90 wt. %).

In one aspect, the present disclosure provides an article comprising a substrate, and disposed adjacent the substrate, a layer having a first side adjacent the substrate and an opposed second side. The disposed layer comprises graphitic carbon and diamond-like carbon, present in a combined amount of 60-98 wt. %; and aerogel, present in an amount of 2-40 wt. %.

In certain embodiments as otherwise described herein, the first side of the disposed layer comprises at least 50 wt. % of a combined amount of graphitic carbon and diamond-like carbon; and the second side of the disposed layer comprises at least 50 wt. % aerogel. In certain embodiments, the first side of the disposed layer comprises at least 70 wt. %, or at least 80 wt. %, or at least 90 wt. %, or at least 95 wt. %, or at least 99 wt. % of a combined amount of graphitic carbon and diamond-like carbon. In certain embodiments, the second side of the disposed layer comprises at least 60 wt. %, or at least 70 wt. %, or at least 75 wt. %, or at least 80 wt. % aerogel. For example, in certain desirable embodiments, the first side of the disposed layer comprises substantially (e.g., at least 90 wt. %, or at least 95 wt. %) a combined amount of graphitic carbon and diamond-like carbon, and the second side of the disposed layer comprises at least 60 wt. %, or at least 70 wt. % aerogel.

In certain embodiments as otherwise described herein, at least a portion of the aerogel is disposed interstitially between spaced features extending perpendicularly to the substrate and comprising at least a portion of the graphitic carbon and diamond-like carbon, the features having an average spacing of 10-2000 nm. Such features can be formed, for example, by co-depositing (e.g., by sputtering onto a substrate) diamond-like carbon and graphitic carbon—which can each disrupt the long-range alignment of the other, limiting domain size and orientation thereof—to provide a carbon layer having a relatively rough surface. In certain embodiments, the surface roughness of such a deposited material can be increased by etching (e.g., by reactive ion etching). In certain embodiments, the features can be formed by performing two or more cycles, each cycle including co-deposition followed by etching.

Accordingly, in certain embodiments as otherwise described herein, one or more of the features (e.g., each feature) independently comprise a mixture of graphitic carbon and diamond-like carbon. In certain such embodiments, the diamond-like carbon is present in one or more of the features (e.g., each feature) as diamond-like-carbon domains having an average size of 1-250 nm, e.g., 1-150 nm, or 1-100 nm, or 1-50 nm, or 1-25 nm. In certain such embodiments, the graphitic carbon is present in one or more of the features (e.g., each feature) as graphitic-carbon domains having an average size of 1-250 nm, e.g., 1-150 nm, or 1-100 nm, or 1-50 nm, or 1-25 nm.

In certain embodiments as otherwise described herein, the features can be extended and have a cross-section perpendicular to the extended axis, the cross-section having an average width and a respective average height or depth. In certain embodiments, the features can comprise extended ridges. In certain embodiments, one or more of the features can be relatively discrete. For example, in certain embodiments as otherwise described herein, the features can be pyramid-like, post-like, or cone-like.

In certain embodiments as otherwise described herein, the features have an average height of 50-2000 nm. For example, in certain such embodiments, the features have an average height of 50-1200 nm, or 50-800 nm, or 50-500 nm, or 75-1200 nm, or 75-800 nm, or 75-500 nm, or 100-1200 nm, or 100-800 nm, or 100-500 nm. In certain embodiments as otherwise described herein, the features have an average width of 25-500 nm. For example, in certain such embodiments, the features have an average width of 25-400 nm, or 25-300 nm, or 50-500 nm, or 50-400 nm, or 50-300 nm.

In certain embodiments as otherwise described herein, the average slope of one or more of the features (e.g., of each feature) is at most 60° from normal (i.e., defined relative to the substrate). For example, in certain such embodiments, the average slope of one or more of the features (e.g., of each feature) is at most 50° from normal, or at most 40° from normal. In certain embodiments, the average slope one or more of the features (e.g., of each feature) is 5-60°, or 5-50°, or 5-45°, or 10-60°, or 10-50°, or 10-45°, or 15-60°, or 15-50°, or 15-45° from normal.

As described above, in certain embodiments as otherwise described herein, the average spacing of the features is 10-2000 nm. For example, in certain such embodiments, the average spacing of the features is 10-1500 nm, or 10-1000 nm, or 50-2000 nm, or 50-1500 nm, or 50-1000 nm, or 100-2000 nm, or 100-1500 nm, or 100-1000 nm. In certain embodiments, the features can be distributed relatively uniformly (e.g., having an isotropic, unimodal distribution of spacings). Accordingly, in certain embodiments as otherwise described herein, the average distance of each feature of the textured surface to its nearest neighboring feature differs from the average spacing of the features by less than 25%, e.g., less than 15%, or less than 10%. Of course, in other embodiments, the features can be distributed relatively non-uniformly (e.g., having an anisotropic and/or multimodal distribution of spacings). Accordingly, in certain embodiments as otherwise described herein, the average distance of each feature of the textured surface to its nearest neighboring feature is 50-1000 nm, e.g., 50-750 nm, or 50-500 nm, or 75-1000 nm, or 75-750 nm, or 75-500 nm, or 100-1000 nm, or 100-750 nm, or 100-500 nm.

As described above, the disposed layer comprises aerogel. In certain embodiments as otherwise described herein, the aerogel comprises (e.g., is in the form of) a plurality of aerogel particles having an average size of 15-250 nm. In certain embodiments, the aerogel particles have an average size of 15-100 nm, or 15-75 nm, or 25-250 nm, or 25-100 nm, or 25-75 nm, or 40-250 nm, or 40-100 nm, or 40-75 nm. The average aerogel particle size can represent an average linear dimension of the particles (e.g., an average diameter in the case of substantially spherical particles), and it may represent an average grain or crystallite size, or, in the case of agglomerated particles, an average agglomerate size. In certain embodiments, the aerogel particles have a surface area of 600-800 $m^2/g$, and a density of 100-200 $kg/m^3$.

An embodiment of such an article is shown in schematic cross-sectional view in FIG. 1. Article 100 of FIG. 1 includes a substrate 110 and a disposed layer 120 having a first side 122 adjacent the substrate 110 and an opposed second side 124. Disposed layer 120 includes aerogel present in the form of a plurality of aerogel particles 134, disposed interstitially between spaced features of the layer 120, including spaced features 126, 128, 130, 132, each comprising graphitic carbon and diamond-like carbon.

Such aerogel particles may be obtained by processing precursor powder to reduce the average particle size, e.g., to about 100 nm or smaller. The aerogel nanoparticles may include nanoscale surface asperities, i.e., a nanoscale surface texture characterized by protruding or sharp features separated by recessed features and/or pores at the particle surface. As the person of ordinary skill in the art will appreciate, the scale of the surface texture is smaller than the average size of the particle; generally, surface asperities are at least about 50% smaller. For example, aerogel particles of about 100 nm in average particle size may include surface asperities of about 50 nm in average size or less, and hydrophobic particles of about 50 nm in average particle size may include surface asperities of about 25 nm in size or less.

Suitable aerogel precursor powders are commercially available from a number of sources, including Cabot Corp. (Boston, Mass.). Suitable aerogel precursor powders are sold under the Nanogel® Aerogel, LUMIRA® Aerogel and ENOVA® Aerogel trade names, and include, for example ENOVA™ Aerogel IC 3110, ENOVA™ Aerogel MT 1100, ENOVA™ Aerogel MT 1200, ENOVA™ Aerogel IC 3120. These porous, nanostructured particles are available in particle sizes ranging from about 5 microns to 4 mm, but may be mechanically milled or sonicated as discussed below to obtain particles of reduced sizes (e.g., 10-90 nm) suitable for the interstices between the spaced features as otherwise described herein.

In other embodiments as described herein, the aerogel comprises one or more continuous aerogel domains extending, in a direction parallel to the substrate, at least 500 nm. As used herein, "aerogel domains" include discrete moieties comprising at least 50 wt. % (e.g., at least 75 wt. %, or at least 90 wt. %, or at least 95 wt. %) aerogel. Aerogel domains can also include other components such as, for example, binders, aerogel precursors, impurities, etc.

Figure 2:
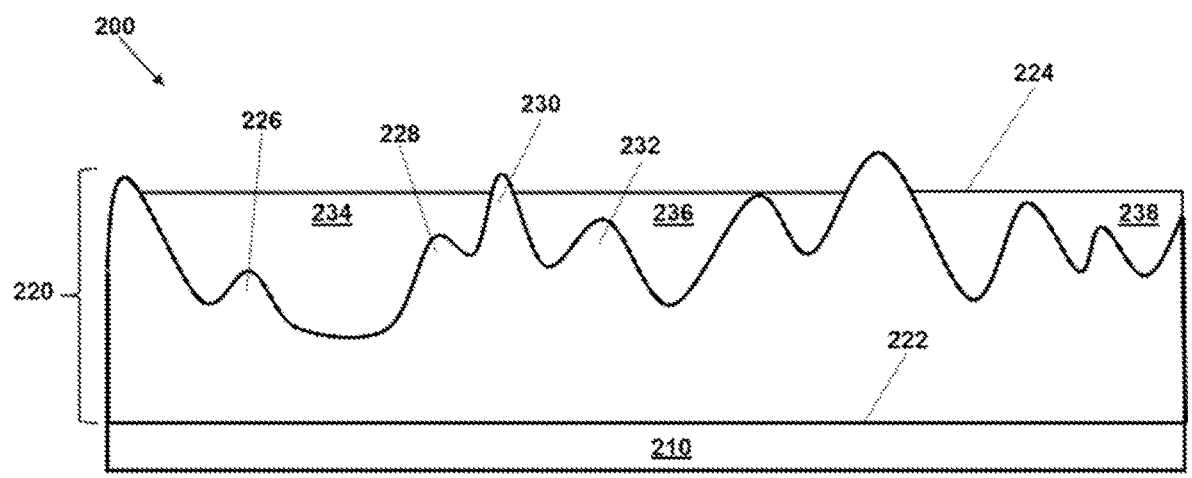
FIG. 2 is a schematic cross-sectional view of an article according to one embodiment of the disclosure.

An embodiment of such an article is shown in schematic cross-sectional view in FIG. 2. Article 200 of FIG. 2 includes a substrate 210 and a disposed layer 220 having a first side 222 adjacent the substrate 210 and an opposed second side 224. Disposed layer 220 includes aerogel present in the form of continuous aerogel domains 234, 236, 238, disposed interstitially between spaced features of the layer 220, including spaced features 226, 228, 230, 232, each comprising graphitic carbon and diamond-like carbon.

For example, in certain embodiments, the aerogel comprises one or more continuous aerogel domains extending, on average, at least 1 μm, or at least 5 μm, or at least 10 μm, or at least 100 μm, or at least 250 μm, or at least 500 μm. Such domains can be formed, for example, by providing an aerogel precursor (e.g., a sol-gel network) disposed adjacent to at least a portion of a textured surface of a carbon layer (e.g., as otherwise described herein), and converting at least a portion of the aerogel precursor to an aerogel (e.g., by supercritical solvent extraction from the sol-gel).

In certain embodiments as otherwise described herein, the aerogel is a silica aerogel. Of course, in other embodiments, the aerogel can be a type other than silica, such as, for example, a metal oxide aerogel or an organic aerogel.

In certain embodiments as otherwise described herein, the substrate comprises (e.g., is) a glass. For example, in certain such embodiments, the substrate comprises (e.g., is) a silicate glass, e.g., an alkali borosilicate glass, or an alkali aluminosilicate glass.

In certain embodiments as otherwise described herein, the disposed layer comprises a hydrophobic material, present on at least a portion of an interface of the aerogel and the graphitic carbon and/or diamond-like carbon. For example, in certain such embodiments, the disposed layer comprises a hydrophobic silane, present on at least a portion of an interface of the aerogel and the graphitic carbon and/or diamond-like carbon. In certain embodiments as otherwise described herein, the hydrophobic silane is covalently linked to the graphitic carbon and/or diamond-like carbon.

Such interfacial hydrophobic silanes may be obtained by treating at least a portion of the surface of a carbon layer (e.g., formed by co-depositing diamond-like carbon and graphitic carbon) with one or more compounds selected from organosilanes, fluorinated silanes, and disilazanes (e.g., before disposing aerogel adjacent to at least a portion of the treated surface). Such treatment can include, for example, covalently linking the one or more compounds to the surface, or in another example, depositing a thin (e.g., 0.5-5 nm) film of the one or more compounds onto the surface.

Suitable organosilanes include, but are not limited to alkylchlorosilanes; alkoxysilanes, e.g., methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, butyltrimethoxysilane, butyltriethoxysilane, hexyltrimethoxysilane, octyltrimethoxysilane, 3-mercaptopropyltrimethoxysilane, n-octyltriethoxysilane, phenyltriethoxysilane, and polytriethoxysilane; trialkoxyarylsilanes; isooctyltrimethoxy-silane; N-(3-triethoxysilylpropyl) methoxyethoxyethoxy ethyl carbamate; N-(3-triethoxysilylpropyl)methoxyethoxyethoxyethyl carbamate; polydialkylsiloxanes including, e.g., polydimethylsiloxane; arylsilanes including, e.g., substituted and unsubstituted arylsilanes; alkylsilanes including, e.g., substituted and unsubstituted alkyl silanes including, e.g., methoxy and hydroxy substituted alkyl silanes; and combinations thereof. Suitable alkylchlorosilanes include, for example, methyltrichlorosilane, dimethyldichlorosilane, trimethylchlorosilane, octylmethyldichlorosilane, octyltrichlorosilane, octadecylmethyldichlorosilane and octadecyltrichlorosilane. Other suitable materials include, for example, methylmethoxysilanes such as methyltrimethoxysilane, dimethyldimethoxysilane and trimethylmethoxysilane; methylethoxysilanes such as methyltriethoxysilane, dimethyldiethoxysilane and trimethylethoxysilane; methylacetoxysilanes such as methyltriacetoxysilane, dimethyldiacetoxysilane and trimethylacetoxysilane; vinylsilanes such as vinyltrichlorosilane, vinylmethyldichlorosilane, vinyldimethylchlorosilane, vinyltrimethoxysilane, vinylmethyldimethoxysilane, vinyldimethylmethoxysilane, vinyltriethoxysilane, vinylmethyldiethoxysilane and vinyldimethylethoxysilane.

Suitable fluorinated silanes include fluorinated alkyl-, alkoxy-, aryl- and/or alkylaryl-silanes, and fully perfluorinated alkyl-, alkoxy-, aryl- and/or alkylaryl-silanes. An example of a suitable fluorinated alkoxy-silane is perfluorooctyltrimethoxysilane.

Suitable disilazanes include, for example, hexamethyldisilazane, divinyltetramethyldisilazane and bis(3,3-trifluoropropyl)tetramethyldisilazane. Cyclosilazanes are also suitable, and include, for example, octamethylcyclotetrasilazane.

In certain embodiments as otherwise described herein, the disposed layer has an average thickness of 400-5000 nm. For example, in certain embodiments as otherwise described herein, the disposed layer has an average thickness of 400-3000 nm, or 400-2000 nm, or 500-5000 nm, or 500-3000 nm, or 500-2000 nm, or 750-5000 nm, or 750-3000 nm, or 750-2000 nm.

Advantageously, the disposed layer can be transparent to visible, near-infrared, and short-wave infrared light. Accordingly, in certain embodiments as otherwise described herein, the disposed layer has a light transmissivity of at least 90% (e.g., at least 95%, at least 98%, or at least 99%) for wavelengths between 400 nm and 1,600 nm. In certain embodiments as otherwise described herein, the disposed layer has a light transmissivity of at least 95% (e.g., at least 98%, or at least 99%, or at least 99.5%) for wavelengths between 400 nm and 940 nm.

As noted above, the disposed layer can desirably be superhydrophobic. Accordingly, in certain embodiments as otherwise described herein, the second side of the disposed layer has a water contact angle of at least 130°, e.g., at least 140°, or at least 150°.

Another aspect of the disclosure is a method for preparing a coated substrate (e.g., as described herein) comprising providing a carbon layer disposed on a substrate, the carbon layer having a first side adjacent the substrate and an opposed second side having a textured surface, the carbon layer comprising at least 80 wt. % of a combined amount of graphitic carbon and diamond-like carbon. The textured surface comprises a plurality of spaced features extending perpendicularly to the substrate and comprising at least a portion of the graphitic carbon and diamond-like carbon, the features having an average spacing of 10-2000 nm. The method further includes disposing aerogel adjacent to at least a portion of the textured surface.

Figure 3:
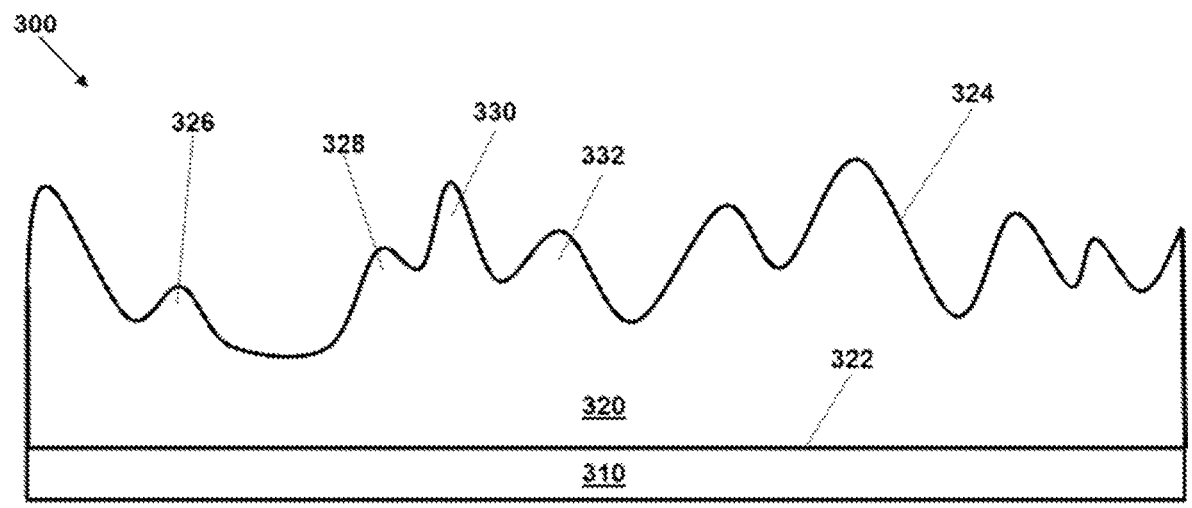
FIG. 3 is a schematic cross-sectional view of a disposed carbon layer according to one embodiment of the disclosure.

An embodiment of such a disposed layer is shown in schematic cross-sectional view in FIG. 3. Layer 300 of FIG. 3 includes a substrate 310 and a carbon layer 320 having a first side 322 adjacent the substrate 310 and an opposed second side 324 having a textured surface. Carbon layer 320 includes spaced features, including features 326, 328, 330, 332, each comprising graphitic carbon and diamond-like carbon.

In certain embodiments as otherwise described herein, one or more of the features (e.g., each feature) of the textured surface independently comprise a mixture of graphitic carbon and diamond-like carbon. In certain such embodiments, the diamond-like carbon is present in one or more of the features (e.g., each feature) as diamond-like-carbon domains having an average size of 1-250 nm, e.g., 1-150 nm, or 1-100 nm, or 1-50 nm, or 1-25 nm. In certain such embodiments, the graphitic carbon is present in one or more of the features (e.g., each feature) as graphitic-carbon domains having an average size of 1-250 nm, e.g., 1-150 nm, or 1-100 nm, or 1-50 nm, or 1-25 nm.

The person of ordinary skill in the art will appreciate that the textured surface of the carbon layer (i.e., inclusive of the spaced features of the textured surface) comprises a surface roughness. As used herein, surface roughness includes the "vertical" variation of the height of a surface (i.e., perpendicular to the major dimensions of the surface) and the "horizontal" variation of the height of a surface (i.e., parallel to the major dimensions of the surface). The person of ordinary skill in the art will further appreciate that root-mean-square (RMS) roughness can describe "vertical" roughness, while "horizontal" roughness can be characterized by height-height correlation length (horizontal correlation length; $\xi$).

In certain embodiments as otherwise described herein, the textured surface of the carbon layer comprises a surface roughness having an RMS roughness of 50-2000 nm. For example, in certain embodiments as otherwise described herein, the RMS roughness of the textured surface is 50-1200 nm, or 50-800 nm, or 50-500 nm, or 75-1200 nm, or 75-800 nm, or 75-500 nm, or 100-1200 nm, or 100-800 nm, or 100-500 nm.

In certain embodiments as otherwise described herein, the textured surface of the carbon layer comprises a surface roughness having a height-height correlation length of 25-500 nm. For example, in certain embodiments as otherwise described herein, the height-height correlation length of the textured surface is 25-400 nm, or 25-300 nm, or 50-500 nm, or 50-400 nm, or 50-300 nm.

The person of ordinary skill in the art will appreciate that the textured surface of the carbon layer comprises a distribution of slopes. The slope distribution of the textured surfaces described herein can be non-normal, and can be unimodal or multimodal. In certain embodiments as otherwise described herein, the textured surface comprises a slope distribution including at least one mode that is at most 60° from normal (i.e., defined relative to the substrate). For example, in certain such embodiments, the textured surface comprises a slope distribution including at least one mode that is at most 50° from normal, or at most 40° from normal. In certain embodiments, the textured surface comprises a slope distribution including at least one mode that is 5-60°, or 5-50°, or 5-45°, or 10-60°, or 10-50°, or 10-45°, or 15-60°, or 15-50°, or 15-45° from normal.

In certain embodiments as otherwise described herein, the average spacing of the features of the textured surface is 10-2000 nm. For example, in certain such embodiments, the average spacing of the features is 10-1500 nm, or 10-1000 nm, or 50-2000 nm, or 50-1500 nm, or 50-1000 nm, or 100-2000 nm, or 100-1500 nm, or 100-1000 nm. In certain embodiments as otherwise described herein, the features can be distributed relatively uniformly (e.g., having an isotropic, unimodal distribution of spacings). Accordingly, in certain embodiments as otherwise described herein, the average distance of each feature of the textured surface to its nearest neighboring feature differs from the average spacing of the features by less than 25%, e.g., less than 15%, or less than 10%. Of course, in other embodiments, the features can be distributed relatively non-uniformly (e.g., having an anisotropic and/or multimodal distribution of spacings). Accordingly, in certain embodiments as otherwise described herein, the average distance of each feature of the textured surface to its nearest neighboring feature is 50-1000 nm, e.g., 50-750 nm, or 50-500 nm, or 75-1000 nm, or 75-750 nm, or 75-500 nm, or 100-1000 nm, or 100-750 nm, or 100-500 nm.

In certain embodiments as otherwise described herein, the carbon layer has an average thickness of 400-3000 nm. For example, in certain embodiments as otherwise described herein, the carbon layer has an average thickness of 400-2000 nm, or 400-1000 nm, or 500-3000 nm, or 500-2000 nm, or 500-1000 nm, or 750-3000 nm, or 750-2000 nm, or 750-1000 nm.

In certain embodiments as otherwise described herein, the substrate comprises (e.g., is) a glass. For example, in certain such embodiments, the substrate comprises (e.g., is) a silicate glass, e.g., an alkali borosilicate glass, or an alkali aluminosilicate glass.

In certain embodiments as otherwise described herein, at least a portion of the textured surface of the carbon layer comprises a hydrophobic silane. In certain such embodiments, the hydrophobic silane is covalently linked to the graphitic carbon and/or diamond-like carbon. In certain embodiments as otherwise described herein, the hydrophobic silane comprises, or is derived from, one or more compounds selected from organosilanes, fluorinated silanes, and disilazanes (e.g., as otherwise described herein).

In certain embodiments as otherwise described herein, the disposed layer comprises a hydrophobic material, present on at least a portion of an interface of the aerogel and the graphitic carbon and/or diamond-like carbon. For example, in certain such embodiments, the disposed layer comprises a hydrophobic silane, present on at least a portion of an interface of the aerogel and the graphitic carbon and/or diamond-like carbon. In certain embodiments as otherwise described herein, the hydrophobic silane is covalently linked to the silicon oxide.

In certain embodiments as otherwise described herein, disposing the aerogel comprises forming a sol-gel network (i.e., by a sol-gel process) adjacent to at least a portion of the textured surface, and drying the sol-gel network to form an aerogel. For example, in certain embodiments as otherwise described herein, disposing the aerogel comprises reacting a silicon alkoxide and water in the presence of a catalyst on the textured surface to form a sol-gel network disposed interstitially between the spaced features of the textured surface, and then forming an aerogel by supercritical solvent extraction of the sol-gel network. In certain embodiments as otherwise described herein, the silicon alkoxide comprises tetramethoxysilane or tetraethoxysilane. In certain embodiments as otherwise described herein, the catalyst comprises ammonium hydroxide or ammonium fluoride. For example, in certain embodiments, the silicon alkoxide is tetraethoxysilane, and the catalyst is ammonium fluoride. In certain embodiments as otherwise described herein, the silicon alkoxide, catalyst, and water are reacted in an alcohol solvent (e.g., ethanol).

In other embodiments, disposing aerogel comprises disposing a suspension of aerogel particles (e.g., as otherwise described herein) adjacent to at least a portion of the textured surface (e.g., and disposed interstitially between the spaced features of the textured surface), and then drying the suspension. In certain such embodiments, the average size of the aerogel particles is 15-250 nm, e.g., 15-100 nm, or 15-75 nm, or 25-250 nm, or 25-100 nm, or 25-75 nm, or 40-250 nm, or 40-100 nm, or 40-75 nm. In certain embodiments as otherwise described herein, the aerogel particles are suspended in an alcohol (e.g., ethanol).

In certain embodiments as otherwise described herein, the aerogel is a silica aerogel. In other embodiments, the aerogel can be a type other than silica, such as, for example, a metal oxide aerogel or an organic aerogel.

Advantageously, disposing aerogel as described herein can provide a smoothed surface in which each of the aerogel, which exhibits high compressive strength and hydrophobicity, and the spaced features of the carbon layer can protect the other from shear forces. Moreover, due to the particularly low density of aerogel, the index of refraction of the resulting material can, desirably, differ only minimally (or even negligibly) from that of the carbon layer alone.

Accordingly, in certain embodiments as otherwise described herein, disposing aerogel forms a smoothed surface separated from the substrate by the carbon layer, the smoothed surface comprising a surface roughness having an RMS roughness of at most 200 nm. For example, in certain such embodiments, the smoothed surface comprises a surface roughness having an RMS roughness of at most 150 nm, or at most 100 nm, or at most 75 nm, or at most 50 nm. In certain embodiments as otherwise described herein, the smoothed surface comprises at least 50 wt. % aerogel. For example, in certain such embodiments, the smoothed surface comprises at least 60 wt. %, or at least 70 wt. %, or at least 75 wt. %, or at least 80 wt. % aerogel.

The carbon layer described herein can be provided by co-depositing diamond-like carbon and graphitic carbon onto a substrate, for example, by a physical vapor deposition process. For example, in certain embodiments as otherwise described herein, providing the carbon layer comprises sputtering a carbon-containing target material to form at least a portion of the graphitic carbon and diamond-like carbon of the carbon layer. In certain embodiments, providing the carbon layer comprises magnetron sputtering of a graphite-containing target material. In certain such embodiments, the sputtering is reactive sputtering, i.e., carried out in the presence of a reactive gas, such as acetylene or methane.

The carbon layer can have a desired carbon type profile with respect to how much graphitic carbon is present in the carbon layer and/or how much diamond-like carbon is present in the carbon layer. In some embodiments, the carbon layer is predominantly graphitic carbon (i.e., greater than 50 wt. % graphitic carbon and less than 50 wt. % diamond-like carbon). In other embodiments, the carbon layer is predominantly diamond-like carbon (i.e., greater than 50 wt. % diamond-like carbon and less than 50 wt. % graphitic carbon). In some specific examples, the carbon layer comprises at least 10 wt. %, at least 20 wt. %, at least 30 wt. %, at least 40 wt. %, at least 50 wt. %, at least 60 wt. %, at least 70 wt. %, or at least 80 wt. % graphitic carbon. In some specific examples, the carbon layer comprises at least 10 wt. %, at least 20 wt. %, at least 30 wt. %, at least 40 wt. %, at least 50 wt. %, at least 60 wt. %, at least 70 wt. %, or at least 80 wt. % diamond-like carbon.

In some embodiments, a desired carbon type profile is achieved by the deposition process (e.g., sputtering) itself. In other embodiments, a desired carbon type profile is achieved by depositing an initial carbon layer followed by subsequent processing of the initial carbon layer to achieve a final carbon layer with the desired carbon type profile. In some examples, the subsequent processing involves further deposition, growth, and/or annealing steps to preferentially increase the amount of graphitic carbon or diamond-like carbon in the carbon layer. In some examples, the subsequent processing involves preferentially removing (e.g., by etching) either graphitic carbon or diamond-like carbon from the carbon layer.

Etching can increase the surface roughness (e.g., RMS roughness and/or height-height correlation length) of the deposited material. Accordingly, in certain embodiments, providing the carbon layer further comprises etching to remove at least a portion of the sputtered graphitic carbon and diamond-like carbon. In certain such embodiments, the etching is reactive ion etching.

In certain embodiments as otherwise described herein, providing the carbon layer comprises performing two or more cycles, each cycle including sputtering a carbon-containing target material to form at least a portion of the graphitic carbon and diamond-like carbon, and then etching at least a portion of the sputtered graphitic carbon and diamond-like carbon. In certain such embodiments, the number of cycles is sufficient to provide a carbon layer having a thickness and surface roughness as otherwise described herein.

In certain embodiments as otherwise described herein, providing the carbon layer further comprises disposing a hydrophobic silane adjacent at least a portion of the sputtered graphitic carbon and/or diamond-like carbon of the carbon layer. For example, in certain such embodiments, providing the carbon layer comprises one or more cycles of sputtering and etching, and then treating an exposed surface of the sputtered graphitic carbon and/or diamond-like carbon of the carbon layer with one or more compounds selected from organosilanes, fluorinated silanes, and disilazanes (e.g., as otherwise described herein).

The invention claimed is:
1. A method for preparing a coated substrate, comprising:
providing a carbon layer disposed on a substrate, the carbon layer having a first side adjacent the substrate and an opposed second side having a textured surface, the carbon layer comprising at least 10 wt. % graphitic carbon and at least 10 wt. % diamond-like carbon, such that the carbon layer comprises at least 80 wt. % of a combined amount of the graphitic carbon and diamond-like carbon;
providing a hydrophobic silane on the carbon layer, wherein the hydrophobic silane is covalently linked to the graphitic carbon and/or diamond-like carbon, and wherein providing the hydrophobic silane on the carbon layer comprises treating at least a portion of the textured surface of the carbon layer with one or more compounds selected from the group consisting of organosilanes, fluorinated silanes, and disilazanes; and
disposing aerogel adjacent to at least a portion of the textured surface after providing the hydrophobic silane on the carbon layer, wherein the textured surface comprises a plurality of spaced features extending perpendicularly to the substrate and comprising at least a portion of the graphitic carbon and diamond-like carbon, the features having an average spacing of 10-2000 nm.

2. The method of claim 1, wherein the textured surface comprises a surface roughness having an RMS roughness of 50-2000 nm.

3. The method of claim 1, wherein the textured surface comprises a surface roughness having a height-height correlation length of 25-500 nm.

4. The method of claim 1, wherein the textured surface comprises a slope distribution including at least one mode greater than 45° from normal, wherein the normal is defined relative to the substrate.

5. The method of claim 4, wherein the carbon layer has a thickness of 400-3000 nm.

6. The method of claim 1, wherein the substrate comprises a glass.

7. The method of claim 1, wherein the hydrophobic silane is present on at least a portion of an interface of the aerogel and the carbon layer.

8. The method of claim 1, wherein disposing aerogel comprises:
forming a sol-gel network adjacent to at least a portion of the textured surface; and
drying the sol-gel network to form an aerogel.

9. The method of claim 1, wherein disposing aerogel comprises:
disposing a suspension of aerogel particles adjacent to at least a portion of the textured surface; and
drying the suspension.

10. The method of claim 1, wherein disposing aerogel forms a surface separated from the substrate by the carbon layer, the surface comprising a surface roughness having an RMS roughness of at most 200 nm.

11. The method of claim 10, wherein the surface comprises at least 50 wt. % aerogel.

12. The method of claim 1, wherein providing the carbon layer comprises sputtering a carbon-containing target material to form at least a portion of the graphitic carbon and diamond-like carbon of the carbon layer.

13. The method of claim 12, wherein providing the carbon layer further comprises etching to remove at least a portion of the sputtered graphitic carbon and diamond-like carbon.

14. The method of claim 13, wherein providing the hydrophobic silane on the carbon layer is performed after the sputtering and the etching.

15. The method of claim 1, wherein providing the hydrophobic silane on the carbon layer comprises treating the at least the portion of the textured surface of the carbon layer with an organosilane.

16. The method of claim 15, wherein the organosilane is selected from the group consisting of alkylchlorosilanes, alkoxysilanes, trialkoxyarylsilanes, polydialkylsiloxanes, arylsilanes, alkylsilanes, methylmethoxysilanes, methylethoxysilanes, methylacetoxysilanes, and vinylsilanes.

17. The method of claim 1, wherein providing the hydrophobic silane on the carbon layer comprises treating the at least the portion of the textured surface of the carbon layer with a fluorinated silane.

18. The method of claim 17, wherein the fluorinated silane is selected from the group consisting of fluorinated alkyl-, alkoxy-, aryl- and alkylaryl-silanes, and fully perfluorinated alkyl-, alkoxy-, aryl- and alkylaryl-silanes.

19. The method of claim 1, wherein providing the hydrophobic silane on the carbon layer comprises treating the at least the portion of the textured surface of the carbon layer with a disilazane.

20. The method of claim 19, wherein the disilazane is selected from the group consisting of octamethylcyclotetrasilazane, hexamethyldisilazane, divinyltetramethyldisilazane, and bis(3,3-trifluoropropyl)tetramethyldisilazane.

* * * * *